United States Patent
Mou et al.

(10) Patent No.: US 12,085,071 B2
(45) Date of Patent: Sep. 10, 2024

(54) DRIVING CIRCUIT OF FLUID PUMP MODULE

(71) Applicant: MICROJET TECHNOLOGY CO., LTD., Hsinchu (TW)

(72) Inventors: Hao-Jan Mou, Hsinchu (TW);
Ching-Sung Lin, Hsinchu (TW);
Yung-Chang Chen, Hsinchu (TW);
Yung-Lung Han, Hsinchu (TW);
Chi-Feng Huang, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 226 days.

(21) Appl. No.: 17/943,320

(22) Filed: Sep. 13, 2022

(65) Prior Publication Data

US 2024/0035466 A1 Feb. 1, 2024

(30) Foreign Application Priority Data

Jul. 29, 2022 (TW) ................... 111128587

(51) Int. Cl.
*F04B 49/06* (2006.01)
*F04B 17/03* (2006.01)
*H03K 3/017* (2006.01)

(52) U.S. Cl.
CPC ............ *F04B 49/065* (2013.01); *F04B 17/03* (2013.01); *H03K 3/017* (2013.01); *F04B 2203/0201* (2013.01); *F04B 2203/0202* (2013.01)

(58) Field of Classification Search
CPC ............... F04B 17/03; F04B 49/065; F04B 2203/0202; F04B 2203/0201; H03K 3/017

USPC ........................................................ 361/152
See application file for complete search history.

(56) References Cited

U.S. PATENT DOCUMENTS

| | | | | |
|---|---|---|---|---|
| 2014/0070665 | A1* | 3/2014 | Muggler | H10N 30/802 310/314 |
| 2017/0365768 | A1* | 12/2017 | Okaguchi | B06B 1/0207 |
| 2020/0149524 | A1* | 5/2020 | Mou | H10N 30/802 |

FOREIGN PATENT DOCUMENTS

| | | |
|---|---|---|
| CN | 1922401 A | 2/2007 |
| TW | M503225 U | 6/2015 |
| TW | I605681 B | 11/2017 |
| TW | M576757 U | 4/2019 |
| TW | I712258 B | 12/2020 |

(Continued)

*Primary Examiner* — Kevin J Comber
(74) *Attorney, Agent, or Firm* — Birch, Stewart, Kolasch & Birch, LLP

(57) ABSTRACT

A driving circuit of fluid pump module includes a microprocessor, a primary boost circuit, and a pump driving circuit is provided. The microprocessor receives an output signal with a large-width variable rectangular waveform, a driving voltage, a first detection current-feedback signal, and a second detection current-feedback signal. The primary boost circuit converts an inputted driving voltage into a direct current with a certain high voltage. The pump driving circuit receives the certain high voltage and is connected with the microprocessor to receive the voltage control signal and the pulse-width modulation (PWM) signal. The secondary boost circuit receives the certain high voltage to boost the certain high voltage into a working voltage for the fluid pump. The operation driving circuit receives the working voltage and provides the pulse-width modulation signal for the fluid pump through the second detection current-feedback signal.

9 Claims, 5 Drawing Sheets

(56) References Cited

FOREIGN PATENT DOCUMENTS

| TW | I720876 B | 3/2021 |
|----|-----------|--------|
| TW | I724630 B | 4/2021 |

\* cited by examiner

DRIVING CIRCUIT OF FLUID PUMP MODULE

CROSS-REFERENCE TO RELATED APPLICATION

This non-provisional application claims priority under 35 U.S.C. § 119(a) to Patent Application No. 111128587 filed in Taiwan, R.O.C. on Jul. 29, 2022, the entire contents of which are hereby incorporated by reference.

BACKGROUND

Technical Field

The present disclosure relates to a driving circuit of fluid pump module, in particular to a driving circuit for controlling the operation of the fluid pump module in a breast pump.

Related Art

Currently, all kinds of the products used in various fields, such as pharmaceutical industries, computer techniques, printing industries, or energy industries are developed in the trend of elaboration and miniaturization. The fluid transportation devices are crucial components used in for example micro pumps, atomizers, print heads, or the industrial printers. Therefore, how to utilize an innovative structure to break through the bottleneck of the prior art has become an important issue of development. With the rapid advancement of science and technology, the application of fluid transportation device tends to be more and more diversified, for example, the fluid transportation device can be utilized in industrial applications, biomedical applications, healthcare, electronic cooling, even the most popular wearable devices and so on. As the result, the conventional fluid transportation devices gradually have a trend to miniaturize the structure of the pumps and to maximize the flow of the pumps.

As mentioned above, although the trend for the development of the fluid transportation devices is to maximize the fluid flow thereof, the structure design for the fluid transportation devices still has to consider some issues, such as the heat dissipation, the stability, the endurance, and the vibration suppression of the micro pump during operation while maintaining a sufficient fluid flow. Moreover, when the fluid transportation device is utilized in a device for medical and health purposes, the foregoing issues might be more important as they will greatly affect the user's using experience and comfort. Take the breast pump, where the fluid transportation device is utilized as a medical and health application, as an example, currently the market-available electric breast pump, such as the breast pump disclosed in Taiwan patents TWI724630B and TWM503225U, mainly includes a breast suction pad, a breast collecting bottle, a guide pipe, a driving pump, a control circuit, a battery, etc. During the operation of the breast pump, the battery provides the electricity for the operation of the breast pump, the user attaches the suction pad on the breast, the control circuit transmits a driving signal to the driving pump, and the driving pump serves as a fluid transportation device to generate a suction force to draw the breast milk from the breast suction pad to the breast collecting bottle through the guide pipe so as to be stored in the breast collecting bottle, thereby allowing the user to collect the breast milk.

However, to satisfy the requirement of maximizing the fluid flow, the fluid transportation device in the prior art usually adopts a conventional motor as the core component for driving the fluid. The typical motor generally includes a rotor and a stator. The rotor is a rotatable component wounded with coils so as to be electrified with currents, and the stator is a fixed component with a magnet pole to provide a magnetic field for generating the induction electromotive force. The conventional motor has a larger volume and can provide a sufficient fluid flow for a larger fluid transportation device. Nevertheless, when the fluid transportation device is required to be miniaturized or portable, such as adopting in a medical and health device (such as the breast pump), the fluid transportation device with the conventional motor as the core component is difficult to be miniaturized. Moreover, since the conventional motor is operated through conversions between electromagnetic energies and kinetic energies, high decibel level noise is generated during the operation of the conventional motor. As a result, the issue of severe noise for the user is emerged when the conventional motor is utilized in the breast pump and is required to be improved. Consequently, the core driving component of a common fluid transportation device known in the art adopts a microelectromechanical systems (MEMS) pump driven based on the piezoelectric principle to reduce the noise during the operation of the fluid transportation device.

Therefore, in the case of the present breast pump, there are two ways to improve the device; one is to modify the motor-based core component into fluid-driving type (that is, do not adopt the motor-driven configuration), the other is to modify the motor-based core component into a novel MEMS pump which is driven by piezoelectric effect. Furthermore, after replacing the core component of a breast pump which originally adopts a conventional motor with an MEMS pump, how to allow the known breast pump using the conventional motor to be compatible and operate with the driving control architecture of the MEMS pump under the original design of the driving control architecture of the conventional motor without any modification, so as to allow the conventional motor adopted in the present breast pump as an core component of driving fluid flow to be directly replaced with the novel MEMS pump. Therefore, how to integrate the driving control architecture of the core component of the breast pump for driving fluid is the issues of concern to be developed in the present invention.

SUMMARY

One object of the present disclosure is to integrate the driving control architecture of the core component of a breast pump for driving fluid flow based on the original design of the driving control architecture of the conventional motor. The control signals commonly used is a serial communication digital signal waveform of universal asynchronous receiver/transmitter (UART), a serial communication digital signal waveform of inter-integrated circuit ($I^2C$), or a signal waveform of very-small-width continuous pulse-width modulation (PWM). Such control signals cannot drive and operate the MEMS pump when directly provided for the MEMS pump as input signals. Therefore, one or some embodiments of the present invention provides a driving circuit for controlling the operation of the fluid pump module of a breast pump, so as to integrate the input signals of a conventional motor with the driving control architecture of the MEMS pump and make them compatible.

To achieve above object(s), a general embodiment of the present disclosure is to provide a driving circuit of fluid pump module. The driving circuit includes a filter, a microprocessor, a primary boost circuit, and at least one pump driving circuit. The filter is configured to convert an input signal waveform into an output signal with a large-width variable rectangular waveform. The microprocessor includes a first detection current-feedback circuit and a second detection current-feedback circuit. The microprocessor is configured to receive the output signal with the large-width variable rectangular waveform provided by the filter, a driving voltage, a first detection current-feedback signal provided by the first detection current-feedback circuit, and a second detection current-feedback signal provided by the second detection current-feedback circuit so as to perform computation and analysis to provide a voltage control signal and a pulse-width modulation (PWM) signal for driving and controlling the fluid pump. The primary boost circuit is configured to convert an input driving voltage with a low voltage into a direct current with a certain high voltage. The at least one pump driving circuit is configured to receive the certain high voltage outputted by the primary boost circuit. The at least one pump driving circuit is connected with the microprocessor to receive the voltage control signal and the pulse-width modulation (PWM) signal for driving and controlling the fluid pump provided by the microprocessor. The at least one pump driving circuit includes a secondary boost circuit and an operation driving circuit. The secondary boost circuit is configured to receive the certain high voltage outputted by the primary boost circuit so as to boost the certain high voltage into a higher working voltage demanded by the fluid pump. Through the connection between the secondary boost circuit and the first detection current-feedback circuit, the microprocessor receives the first detection current-feedback signal provided by the first detection current-feedback circuit to determine whether a current outputted by the secondary boost circuit is steady so as to determine whether to feedback and adjust the voltage control signal provided to the secondary boost circuit, so as to allow the secondary boost circuit to boost the certain high voltage into the higher working voltage and steadily outputs the working voltage as demanded by the fluid pump. The operation driving circuit is configured to receive the working voltage steadily outputted by the secondary boost circuit so as to provide the working voltage demanded by the fluid pump and an optimum operation frequency for operating the fluid pump. Through the connection between the operation driving circuit and the second detection current-feedback circuit, the microprocessor receives the second detection current-feedback signal provided by the second detection current-feedback circuit to determine whether a working current outputted by the operation driving circuit is maximum so as to determine whether to feedback and adjust an optimum pulse amplitude of the pulse-width modulation signal to the operation driving circuit, so that the operation driving circuit outputs an optimum pulse-width modulation signal for maximum operating the fluid pump.

BRIEF DESCRIPTION OF THE DRAWINGS

The disclosure will become more fully understood from the detailed description given herein below, for illustration only and thus not limitative of the disclosure, wherein.

DETAILED DESCRIPTION

The present disclosure will be described in detail by way of preferred embodiments and aspects. The following description provides specific details for implementing the present disclosure so as to allow the reader to have a thorough understanding of how to carry out these embodiments. It is understood by those skilled in the art, however, that the present disclosure may be practiced without these details. In addition, the present disclosure may be utilized and implemented by other specific embodiments, and the details set forth herein may be utilized according to different requirements with various modifications or variations without departing from the spirit of the present disclosure, and therefore the present disclosure will be described in terms of preferred embodiments and aspects, such descriptions are only intended to explain and illustrate the structure of the present disclosure rather than limiting the scope of the claims of the present invention. The terms used in the following description will be construed in the broadest reasonable way so that they can be used in conjunction with the detailed description of a particular embodiment of the present disclosure.

Figure 1A:
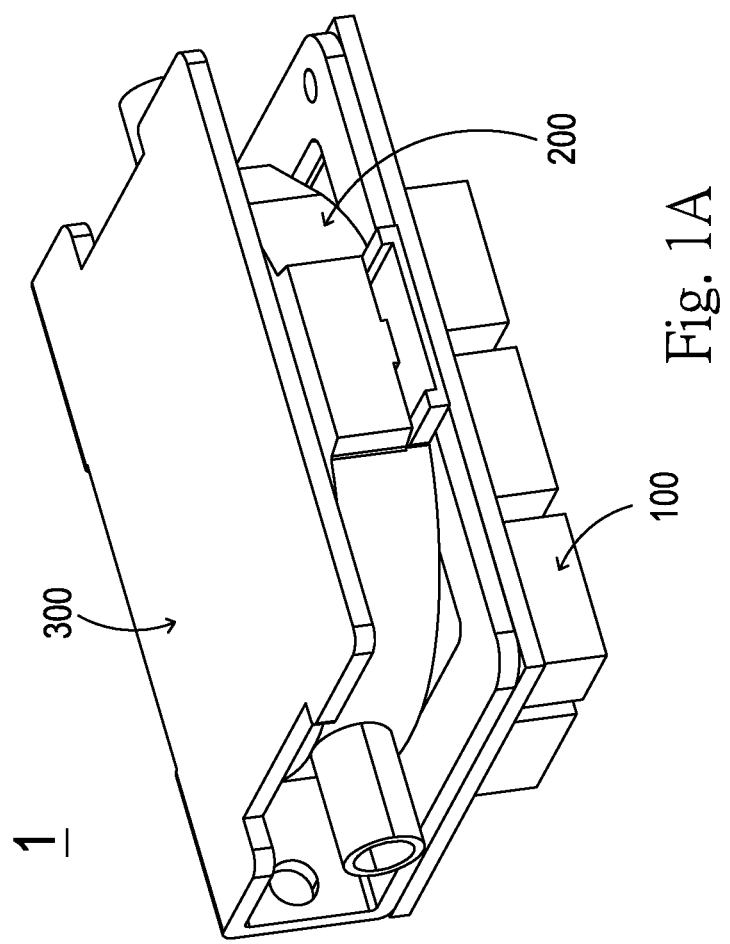
FIG. 1A illustrates a schematic perspective view of a driving circuit of fluid pump module used in a fluid pump of an exemplary embodiment in the present disclosure.
Figure 1B:
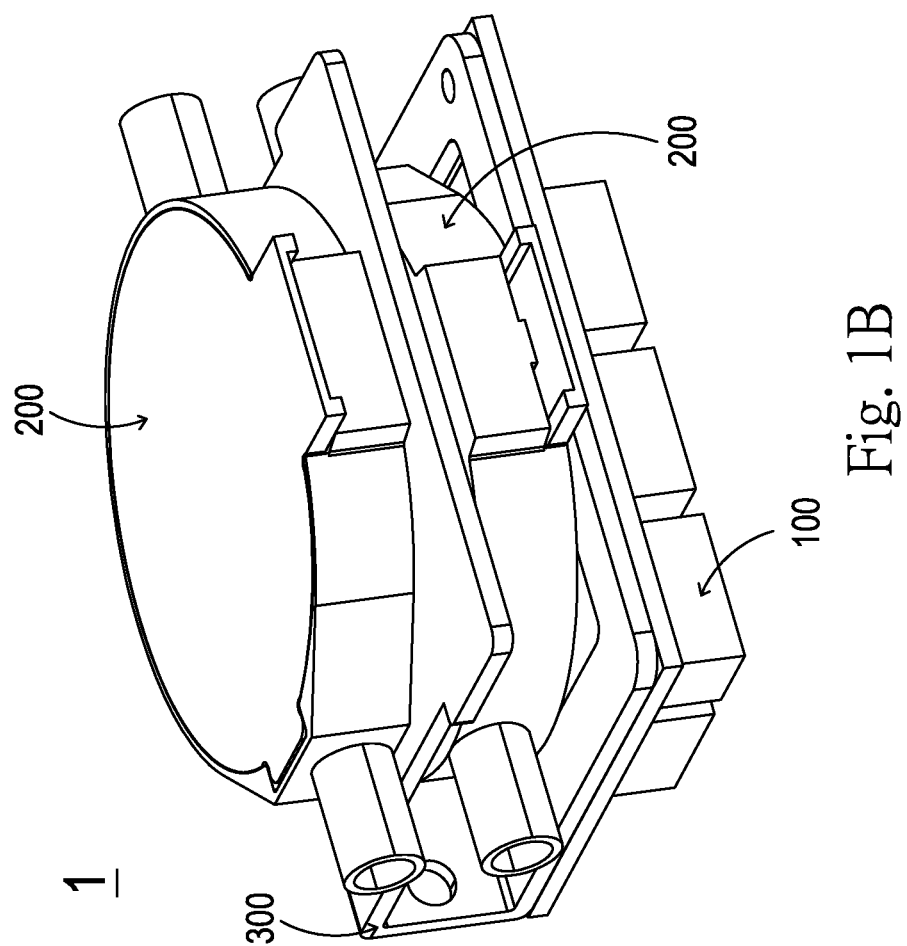
FIG. 1B illustrates a schematic perspective view of a driving circuit of fluid pump module used in a fluid pump of another exemplary embodiment in the present disclosure.
Figure 2:
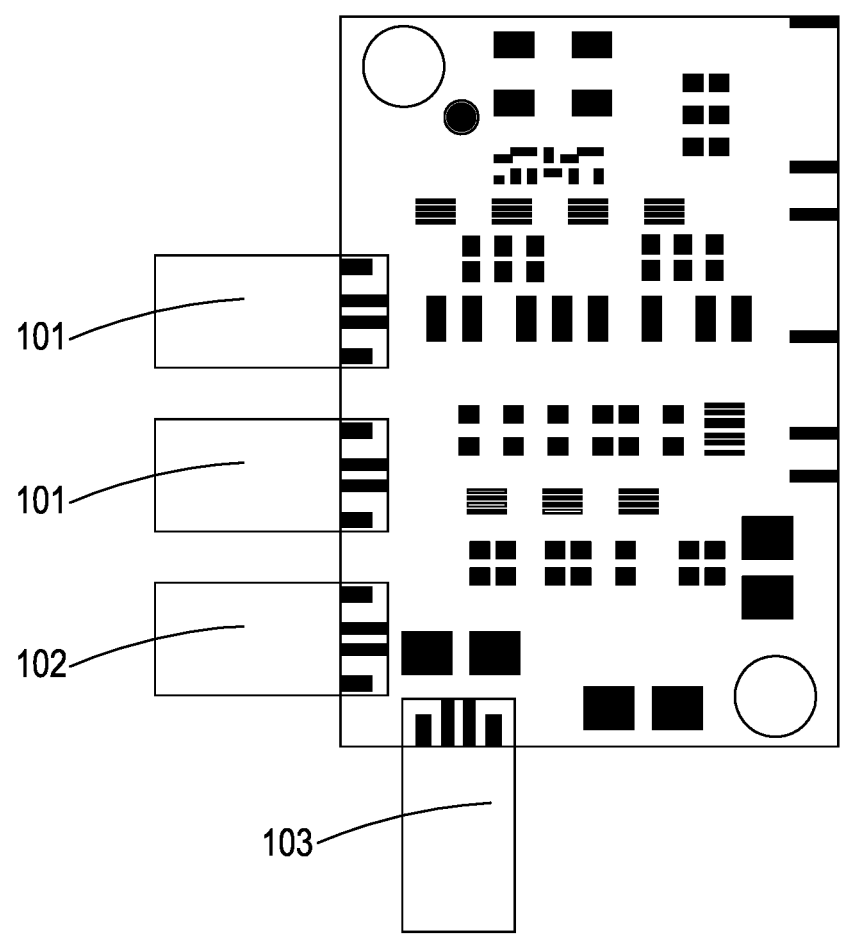
FIG. 2 illustrates a schematic view showing that the architecture of the driving circuit of fluid pump module includes control interfaces for controlling the operation of the fluid pump such as the power supply terminal, the input signal terminal, and the pump driving circuit output terminal.

Please refer to FIG. 1A, FIG. 1B, and FIG. 2. According to one aspect of the present disclosure, the driving circuit 100 of fluid pump module can be utilized in a fluid pump module 1 formed by N fluid pumps 200. In one embodiment, the fluid pump module 1 includes a driving circuit 100 of fluid pump module, a fluid pump 200, and a fixation substrate 300, wherein the driving circuit 100 of fluid pump module is disposed on a bottom portion of the fixation substrate 300, and the fluid pump 200 is disposed in a receiving space of the fixation substrate 300. In another embodiment of the present disclosure, the fluid pump module 1 may include a driving circuit 100 of fluid pump module, two fluid pumps 200, and a fixation substrate 300; similarly, the driving circuit 100 of the fluid pump module is disposed on a bottom portion of the fixation substrate 300, and the fixation substrate 300 is sandwiched between and in contact with the two fluid pumps 200, so that the driving circuit 100 of fluid pump module, the fluid pumps 200, and the fixation substrate 300 can be assembled and integrated with each other. It is noted that, for a person having ordinary skills in the art, the fluid pump module 1 can include one or more fluid pumps 200 based on different requirements, and thus "N" in the N fluid pumps 200 is a positive integer and is equal to or more than 1, and the fluid pump 200 is controlled by the driving circuit 100 of the fluid pump module 1. As shown in FIG. 2, the driving circuit 100 of the fluid pump module 1 includes N pump driving circuit output terminals 101, an input signal terminal 102, and a power input terminal 103, wherein the N pump driving circuit output terminals 101 correspond to the N fluid pumps 200. The pump driving circuit output terminals 101, the input signal terminal 102, and the power input terminal 103 are disposed on the driving circuit 100 of fluid pump module. The input signal terminal 102 is configured to transmit the input signal for controlling the operation of the driving circuit 100 of fluid pump module, the power input terminal 103 is configured to transmit a driving voltage for operating the driving circuit 100 of fluid pump module, and the pump driving circuit output terminal 101 is configured to output a working current and a pulse-width modulation (PWM) signal for controlling the operation of the fluid pump 200.

Figure 3:
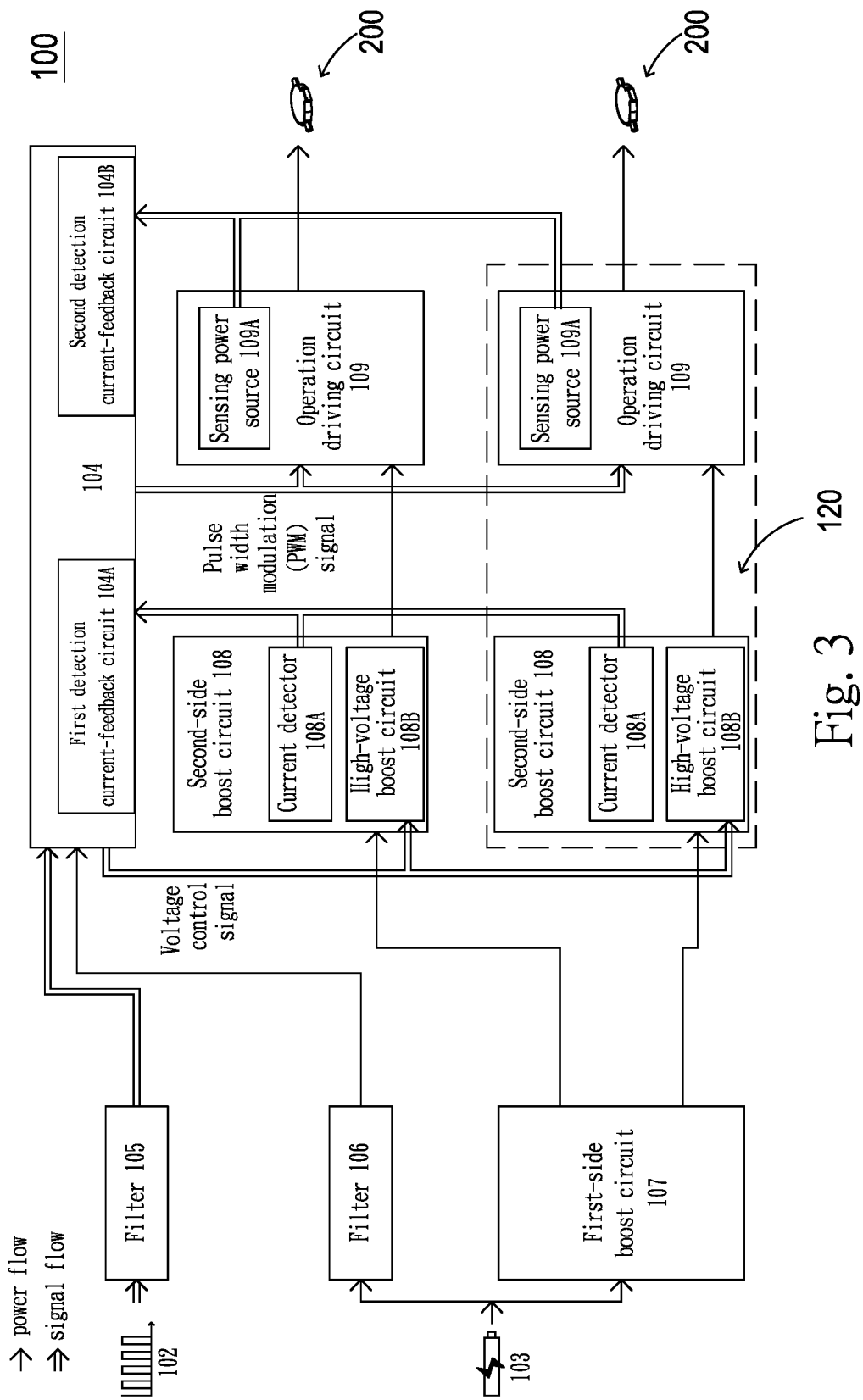
FIG. 3 illustrates a detailed architecture of the driving circuit of fluid pump module of an exemplary embodiment in the present disclosure.

Please further refer to FIG. 3, in order to control the operation of the fluid pump module 1, one embodiment of the present disclosure provide an architecture of driving circuit 100 of fluid pump module. The driving circuit 100 of fluid pump module includes a filter 105 and a microprocessor 104. The filter 104 is configured to convert an input signal waveform (e.g., the very-small-width continuous pulse width (PWM) signal waveform outputted through the input signal terminal 102 shown in FIG. 4) into an output signal with a large-width variable rectangular waveform (e.g., the output signal with a rectangular waveform shown in the right side of FIG. 4). The microprocessor 104 further includes a first detection current-feedback circuit 104A and a second detection current-feedback circuit 104B. The microprocessor 104 receives the output signal with the large-width variable rectangular waveform, a driving voltage, a first detection current-feedback signal provided by the first detection current-feedback circuit 104A, and a second detection current-feedback signal provided by the second detection current-feedback circuit 104B so as to perform analysis to provide a voltage control signal and a pulse-width modulation (PWM) signal which are demanded by the fluid pump 200. Moreover, the driving circuit 100 of fluid pump module further includes a primary boost circuit 107 and at least one pump driving circuit 120. The primary boost circuit 107 is configured to convert the input driving voltage with a low voltage into a direct current with a certain high voltage. The at least one pump driving circuit 120 is configured to receive the certain high voltage outputted by the primary boost circuit 107. The at least one pump driving circuit 120 is connected with the microprocessor 104 to receive the voltage control signal and the pulse-width modulation (PWM) signal for driving and controlling the fluid pump 200 provided by the microprocessor 104. The at least one pump driving circuit 120 further includes a secondary boost circuit 108 and an operation driving circuit 109.

Through the aforementioned architecture, the secondary boost circuit 108 receives the certain high voltage outputted by the primary boost circuit 107 and boosts the certain high voltage into a higher working voltage so as to meet the operation requirements of the fluid pump 200. Moreover, through the connection between the secondary boost circuit 108 and the first detection current-feedback circuit 104A, the microprocessor 104 receives the first detection current-feedback signal provided by the first detection current-feedback circuit 104A to determine whether a current outputted by the secondary boost circuit 108 is steady so as to determine whether to feedback and adjust the voltage control signal provided to the secondary boost circuit 108, so that the secondary boost circuit 108 boosts the certain high voltage into the higher working voltage and steadily outputs the working voltage as demanded by the fluid pump 200 so as to meet the operation requirements of the fluid pump 200.

The operation driving circuit 109 receives the working voltage steadily outputted by the secondary boost circuit 108 so as to provide the working voltage demanded by the fluid pump 200 and an optimum operation frequency for operating the fluid pump 200. Moreover, through the connection between the operation driving circuit 109 and the second detection current-feedback circuit 104B, the microprocessor 104 receives the second detection current-feedback signal provided by the second detection current-feedback circuit 104B to determine whether a working current outputted by the operation driving circuit 109 is maximum so as to determine whether to feedback and adjust an optimum pulse amplitude of the pulse-width modulation signal to the operation driving circuit 109, so that the operation driving circuit 109 outputs an optimum pulse-width modulation signal for maximum operating the fluid pump 200.

Furthermore, in one embodiment of the present disclosure, the power for operating the microprocessor 104 may be provided externally; that is, as shown in FIG. 3, the power for operating the microprocessor 104 is provided through the power input terminal 103 and rectified through a rectifier 106 into the working voltage as demand.

Figure 4:
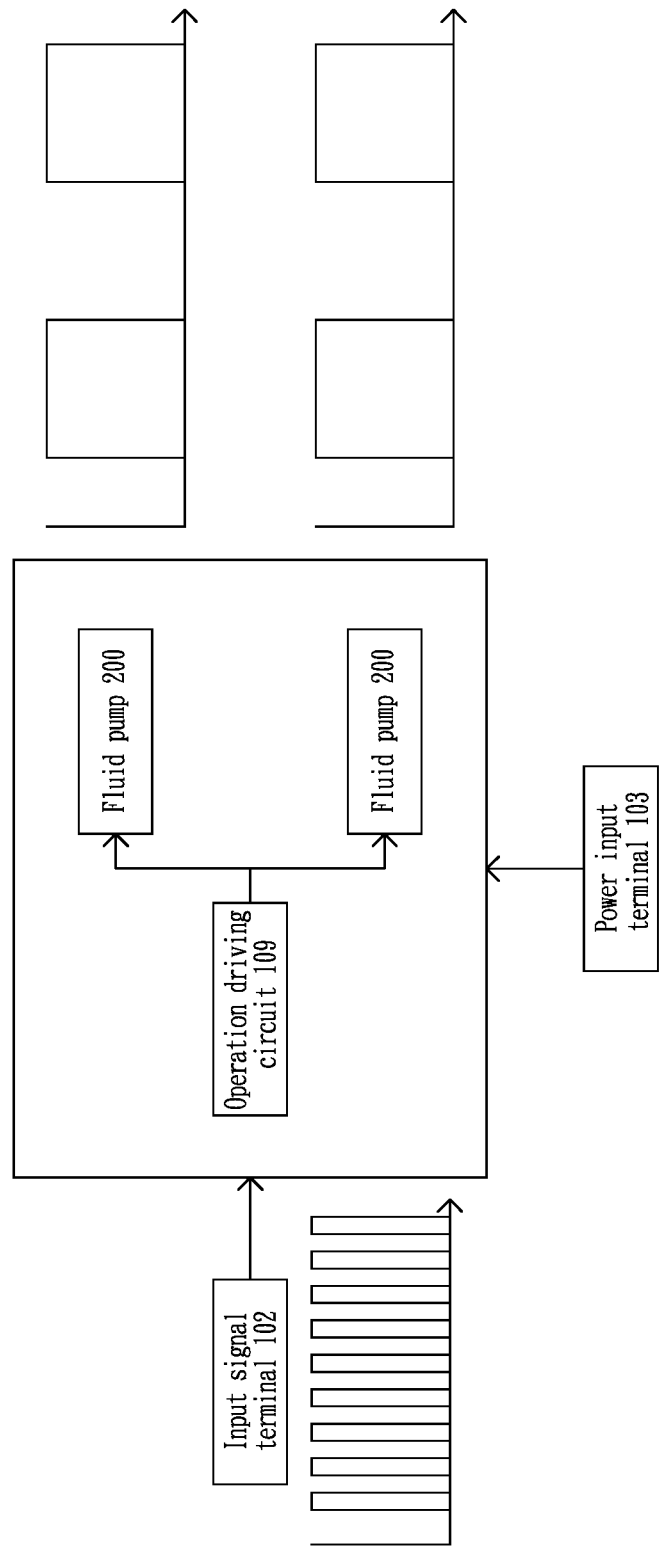
FIG. 4 illustrates technical effect desired to be achieved by the driving circuit of fluid pump module of an exemplary embodiment in the present disclosure.

Please further refer to FIG. 3 and FIG. 4. According to one embodiment of the present disclosure, the secondary boost circuit 108 further includes a current detector 108A and a high-voltage boost circuit 108B. The high-voltage boost circuit 108B is configured to receive the certain high voltage outputted by the primary boost circuit 107 and boost the certain high voltage into the working voltage demanded by the fluid pump 200. The current detector 108A is configured to detect a current of the high-voltage boost circuit 108B and output a current signal to the first detection current-feedback circuit 104A. Then, the microprocessor 104 receives the first detection current-feedback signal provided by the first detection current-feedback circuit 104A for identifying the current signal and determine whether the current outputted by the secondary boost circuit 108 is steady so as to determine whether to feedback and adjust the voltage control signal provided to the secondary boost circuit 108, so as to allow the secondary boost circuit 108 to boost the certain high voltage into the higher working voltage and steadily outputs the working voltage as demanded by the fluid pump.

Moreover, in the foregoing embodiment or other embodiments, the operation driving circuit 109 further includes a sensing power source 109A configured to detect the working current of the operation driving circuit 109 and output a voltage signal to the second detection current-feedback circuit 104B. Then, the microprocessor 104 receives the second detection current-feedback signal provided by the second detection current-feedback circuit 104B to determine whether the working current outputted by the operation driving circuit 109 is maximum so as to determine whether to feedback and adjust the optimum pulse amplitude of the pulse-width modulation signal to the operation driving circuit 109, so that the operation driving circuit 109 outputs the optimum pulse amplitude signal for maximum operating the fluid pump 200.

Please refer to FIG. 4, wherein the operation principle and the technical effect desired to be achieved by the architecture of the driving circuit 100 of fluid pump module are illustrated. In one aspect of the present disclosure, for operating the fluid pump 200, when the architecture of the fluid pump 200 is changed from a conventional motor into an MEMS pump which is driven by piezoelectric effect, the input signal transmitted by the input signal terminal 102 is the input signal of the conventional motor architecture that is narrower (for instance, the very-small-width continuous pulse-width modulation (PWM) signal waveform outputted from the input terminal 102 as illustrated in FIG. 4). When the fluid pump 200 is driven by piezoelectric effect, because the physical properties of the piezoelectric-driven pump is different from the physical properties of the motor, the input signal with the very-small-width continuous pulse-width modulation (PWM) signal waveform cannot drive the piezoelectric-driven pump. As a result, the input signal with narrower pulse-width cannot be directly utilized to control the fluid pump 200. Consequently, according to one or some embodiments of the present disclosure, through the filter 105 of the driving circuit 100 of fluid pump module, when the input signal is transmitted through the filter 105, the pulse-width of the input signal is modulated into an output signal with a large-width variable rectangular waveform. Therefore, after the output signal is fed into the microprocessor 104, the microprocessor 104 can control the pump driving circuit 120 through the output signal with the large-width variable rectangular waveform, so that the pump driving circuit 120 can output a voltage control signal compatible with the fluid pump 200 and a pulse-width modulation signal including an optimum pulse amplitude and an optimum driving frequency. In one embodiment, the input signal according to one or some embodiments of the present disclosure may be a serial communication digital signal waveform of universal asynchronous receiver/transmitter (UART), a serial communication digital signal waveform of inter-integrated circuit (I²C), or a signal waveform of very-small-width continuous pulse-width modulation (PWM).

On the other hand, the driving voltage inputted through the power input terminal 103 is boosted from the original low voltage into a direct current (DC) with a certain high voltage through the primary boost circuit 107. When the direct current with the certain high voltage is fed into the secondary boost circuit 108, the secondary boost circuit 108 further boosts the direct current with the certain high voltage into a working voltage demanded by the fluid pump 200. Therefore, when the working voltage is fed into the operation driving circuit 109, the working voltage can be modulated to be the pulse-width modulation (PWM) signal with a proper pulse-width and the working current. It is noted that, in one or some embodiments of the present disclosure, since the microprocessor 104 further includes the first detection current-feedback circuit 104A and the second detection current-feedback circuit 104B, the microprocessor 104 is able to ensure that each circuit in the driving circuit 100 of fluid pump module can be operated through detecting the current outputted by the secondary boost circuit 108 and the working current of the operation driving circuit 109 in the secondary boost circuit 108 and through determining whether the operation driving circuit 109 are within a preset constant values. When the working voltage outputted by the secondary boost circuit 109 is not enough or when the working current outputted by the operation driving circuit 109 is not maximum, the first detection current-feedback circuit 104A and the second detection current-feedback circuit 104B respectively and correspondingly feedback and adjust the secondary boost circuit 108 and the operation driving circuit 109.

Therefore, according to one or some embodiments of the present disclosure, through the driving circuit 100 of fluid pump module, proper voltage control signal and pulse-width modulation signal as well as proper working voltage and working current can be provided for the fluid pump 200. Therefore, no matter the fluid-driving core of the fluid pump 200 is driven under a motor-based architecture or a piezoelectric-driven MEMS pump-based architecture, the driving circuit 100 of fluid pump module according to one or some embodiments of the present disclosure can be apply to various fluid-driving cores. Hence, the circuitry design of the fluid pump 200 can be compatible with both the original fluid-driving core (e.g., the motor type) and the novel fluid-driving core (e.g., the MEMS pump type), thus the fluid pump module 1 can also be upgraded easily. As a result, the original driving circuit or driving method for the original fluid-driving core does not have to be discarded, and makes the repairing of the module more convenient. In one or some embodiments of the present disclosure, the volume of the fluid pump 200 with the MEMS pump-based architecture may be 0.5-0.8 times of the volume of the motor-based architecture, and the weight of the fluid pump under the MEMS pump-based architecture may be half or less than half of the weight of the motor-based architecture. Therefore, the device (such as the breast pump) adopts the present fluid pump 200 can be thinner and lighter. Moreover, with the configuration of the first detection current-feedback circuit 104A and the second detection current-feedback circuit 104B, the operation of the fluid pump 200 can be more steadily, and the vibration retardation, the heat dissipation, the endurance, and noise reduction during operation of the fluid pump 200 can also be improved correspondingly. Accordingly, in one or some embodiments of the present disclosure, when the driving circuit 100 of fluid pump module is applied to a breast pump, the input signal of the conventional motor can be compatibly integrated with the driving control architecture of the upgraded MEMS pump without any modification. Especially, when the driving circuit 100 of fluid pump module is applied to the breast pump which requires a stable operation, the driving circuit 100 of fluid pump module of present invention provides proper heat dissipation and stable performance during the operation of the fluid pump 200, allowing the user to have a much better using experience. Therefore, according to one or some embodiments of the present disclosure, the issue(s) mentioned in the background can be resolved properly while ensuring a sufficient flow of the device.

According to one or some embodiments of the present disclosure, the driving voltage inputted through the power input terminal 103 is in a range between 3V and 5V; the direct current with certain high voltage converted from the low voltage by the primary boost circuit 107 is 9V; moreover, the high-voltage boost circuit 108B is configured to receive the certain high voltage outputted by the primary boost circuit 107 and boost the certain high voltage into the working voltage demanded by the fluid pump 200, wherein the working voltage is in a range between 28V and 32V. Through these parameters, the driving circuit 100 of the fluid pump module according to one or some embodiments of the present invention can provide effects such as vibration retardation, heat dissipation, endurance, noise reduction during the operation of the device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A driving circuit of fluid pump module comprising:
   a filter configured to convert an input signal waveform into an output signal with a variable rectangular waveform;
   a microprocessor comprising a first detection current-feedback circuit and a second detection current-feedback circuit, wherein the microprocessor is configured to receive the output signal with the variable rectangular waveform, a driving voltage, a first detection current-feedback signal provided by the first detection current-feedback circuit, and a second detection current-feedback signal provided by the second detection current-feedback circuit, so as to perform computation and analysis to provide a voltage control signal and a pulse-width modulation (PWM) signal for driving and controlling a fluid pump;
   a primary boost circuit configured to convert an input driving voltage into a direct current with a certain voltage; and
   at least one pump driving circuit configured to receive the certain voltage outputted by the primary boost circuit, wherein the at least one pump driving circuit is connected with the microprocessor to receive the voltage control signal and the pulse-width modulation (PWM) signal for driving and controlling the fluid pump provided by the microprocessor;
   wherein the at least one pump driving circuit comprises a secondary boost circuit and an operation driving circuit; the secondary boost circuit is configured to receive the certain voltage outputted by the primary boost circuit so as to boost the certain voltage into a higher working voltage demanded by the fluid pump; through the connection between the secondary boost circuit and the first detection current-feedback circuit, the microprocessor receives the first detection current-feedback signal provided by the first detection current-feedback circuit to determine whether a current outputted by the secondary boost circuit is steady so as to determine whether to feedback and adjust the voltage control signal provided to the secondary boost circuit, so as to allow the secondary boost circuit to boost the certain voltage into the higher working voltage and steadily outputs the working voltage as demanded by the fluid pump;
   wherein the operation driving circuit is configured to receive the working voltage steadily outputted by the secondary boost circuit so as to provide the working voltage demanded by the fluid pump and an optimum operation frequency for the fluid pump; through the connection between the operation driving circuit and the second detection current-feedback circuit, the microprocessor receives the second detection current-feedback signal provided by the second detection current-feedback circuit to determine whether a working current outputted by the operation driving circuit is maximum so as to determine whether to feedback and adjust an optimum pulse amplitude of the pulse-width modulation signal to the operation driving circuit, so that the operation driving circuit outputs an optimum pulse-width modulation signal.

2. The driving circuit of fluid pump module according to claim 1, wherein the secondary boost circuit further comprises:
   a boost circuit configured to receive the certain voltage outputted by the primary boost circuit and boost the certain voltage into the working voltage demanded by the fluid pump; and
   a current detector configured to detect a current of the boost circuit and output a current signal to the first detection current-feedback circuit; the microprocessor receives the first detection current-feedback signal provided by the first detection current-feedback circuit for identifying the current signal and determine whether the current outputted by the secondary boost circuit is steady so as to determine whether to feedback and adjust the voltage control signal provided to the secondary boost circuit, so as to allow the secondary boost circuit to boost the certain voltage into the higher working voltage and steadily outputs the working voltage as demanded by the fluid pump.

3. The driving circuit of fluid pump module according to claim 1, wherein the operation driving circuit further comprises a sensing power source configured to detect the working current of the operation driving circuit and output a voltage signal to the second detection current-feedback circuit; the microprocessor receives the second detection current-feedback signal provided by the second detection current-feedback circuit to determine whether the working current outputted by the operation driving circuit is maximum so as to determine whether to feedback and adjust the optimum pulse amplitude of the pulse-width modulation signal to the operation driving circuit, so that the operation driving circuit outputs the optimum pulse-width modulation signal.

4. The driving circuit of fluid pump module according to claim 1, wherein the input driving voltage is in a range between 3V and 5V.

5. The driving circuit of fluid pump module according to claim 1, wherein the certain voltage is 9V.

6. The driving circuit of fluid pump module according to claim 1 wherein the working voltage is in a range between 28V and 32V.

7. The driving circuit of fluid pump module according to claim 1, wherein the input signal is a signal waveform of continuous pulse-width modulation (PWM).

8. The driving circuit of fluid pump module according to claim 1, wherein the input signal is a serial communication digital signal waveform of universal asynchronous receiver/transmitter (UART).

9. The driving circuit of fluid pump module according to claim 1, wherein the input signal is a serial communication digital signal waveform of inter-integrated circuit ($I^2C$).

* * * * *